US008890622B2

(12) United States Patent
Miyashita et al.

(10) Patent No.: US 8,890,622 B2
(45) Date of Patent: Nov. 18, 2014

(54) CASCODE AMPLIFIER

(71) Applicant: Mitsubishi Electric Corporation, Tokyo (JP)

(72) Inventors: Miyo Miyashita, Tokyo (JP); Kazuya Yamamoto, Tokyo (JP); Fumimasa Kitabayashi, Tokyo (JP); Suguru Maki, Tokyo (JP); Eri Fukuda, Tokyo (JP); Katsuya Kato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/908,140

(22) Filed: Jun. 3, 2013

(65) Prior Publication Data

US 2014/0132358 A1 May 15, 2014

(30) Foreign Application Priority Data

Nov. 9, 2012 (JP) .................................. 2012-247144

(51) Int. Cl.
*H03F 1/22* (2006.01)

(52) U.S. Cl.
USPC .......................................... 330/311; 330/286

(58) Field of Classification Search
USPC ............................... 330/53, 54, 286, 310, 311
See application file for complete search history.

(56) References Cited

U.S. PATENT DOCUMENTS

| 6,768,380 | B2 * | 7/2004 | Hong et al. | 330/311 |
| 6,864,750 | B2 * | 3/2005 | Shigematsu | 330/311 |
| 2011/0181360 | A1 * | 7/2011 | Li et al. | 330/277 |
| 2012/0274406 | A1 * | 11/2012 | Kobayashi | 330/310 |

FOREIGN PATENT DOCUMENTS

| JP | 5-259765 | 10/1993 |
| JP | 5-304428 | 11/1993 |
| JP | 2001-94357 | 4/2001 |

* cited by examiner

*Primary Examiner* — Khanh V Nguyen
(74) *Attorney, Agent, or Firm* — Leydig, Voit & Mayer, Ltd.

(57) ABSTRACT

A cascode amplifier includes: first transistors; second transistors cascode-connected with respective first transistors; a first line connected at spaced points to control terminals of the first transistors; a second line connected at spaced points to control terminals of the second transistors; and a capacitance connected between one end of the second line and ground. The second line includes at least two lines connected in parallel with each other.

8 Claims, 13 Drawing Sheets

CASCODE AMPLIFIER

BACKGROUND OF THE INVENTION

1. Field of the Invention

The present invention relates to a cascode amplifier primarily for use in mobile communication devices such as cellular phones.

2. Background Art

Increasing effort is currently being spent in developing cascode amplifiers formed by a CMOS process which are used as a means for reducing the cost of power amplifiers for CDMA cellular phones and other types of cellular phones (see, e.g., Japanese Laid-Open Patent Publication No. H05-259765).

FIG. 16 is a circuit diagram showing the basic configuration of a cascode amplifier. The cascode amplifier is shown within a dashed line rectangle, and the other circuit components shown are required for forming a power amplifier. Transistors Tr1 and Tr2 are n-channel MOS transistors and are connected together in a cascode configuration. An amplifier using cascode-connected transistors is referred to as a "cascode amplifier."

The gate of the transistor Tr1 is connected to an RF input signal terminal IN through an input matching circuit and also connected to a gate bias terminal Vg1. The source of the transistor Tr1 is grounded. That is, the transistor Tr1 is a source-grounded transistor.

The gate of the transistor Tr2 is connected to a gate bias terminal Vg2, and grounded through a capacitance C1. That is, the transistor Tr2 is a gate-grounded transistor. The source of the transistor Tr2 is connected to the drain of the transistor Tr1. The drain of the transistor Tr2 is connected through a transmission line L1 to a drain power terminal Vd of this cascode amplifier, and also connected through an output matching circuit to an RF output signal terminal OUT. The transmission line L1 has a specific electrical length and acts as an inductor.

SUMMARY OF THE INVENTION

Since the transistors of a cascode amplifier constituting a power amplifier have a large gate width, each transistor is divided into smaller transistors. More specifically, the source-grounded transistor of the cascode amplifier is divided into smaller source-grounded transistors, and the gate-grounded transistor is divided into smaller gate-grounded transistors. Each smaller source-grounded transistor and the smaller gate-grounded transistor connected thereto form a cell. The gates of the smaller gate-grounded transistors are connected together by a gate line, and a capacitance is connected between one end of this gate line and ground. It has been found, however, that since the resistance of the gate line increases with the total gate width of the cascode amplifier, an increase in the total gate width may not result in an increase in the output power of the power amplifier, or cascode amplifier.

In view of the above-described problems, an object of the present invention is to provide a cascode amplifier which can minimize reduction of its output power due to wiring resistance.

According to the present invention, a cascode amplifier includes: a plurality of first transistors; a plurality of second transistors cascode-connected with the plurality of first transistors respectively; a first line connected at spaced points along its length to control terminals of the plurality of first transistors; a second line connected at spaced points along its length to control terminals of the plurality of second transistors; and a capacitance connected between one end of the second line and ground. The second line includes at least two lines connected in parallel with each other.

The present invention makes it possible to minimize reduction of its output power due to wiring resistance.

Other and further objects, features and advantages of the invention will appear more fully from the following description.

DETAILED DESCRIPTION OF THE PREFERRED EMBODIMENTS

A cascode amplifier according to the embodiments of the present invention will be described with reference to the drawings. The same components will be denoted by the same symbols, and the repeated description thereof may be omitted.

First Embodiment

Figure 1:
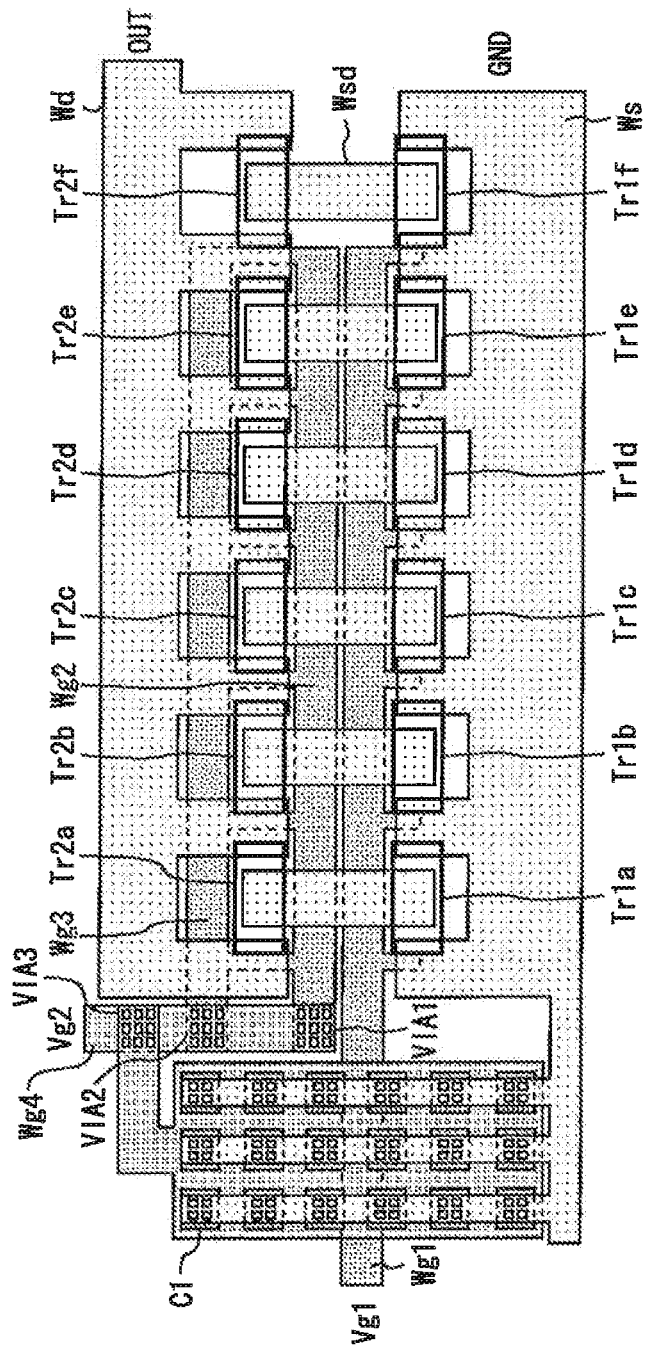
FIG. 1 is a top view of a cascode amplifier in accordance with a first embodiment of the present invention.
Figure 2:
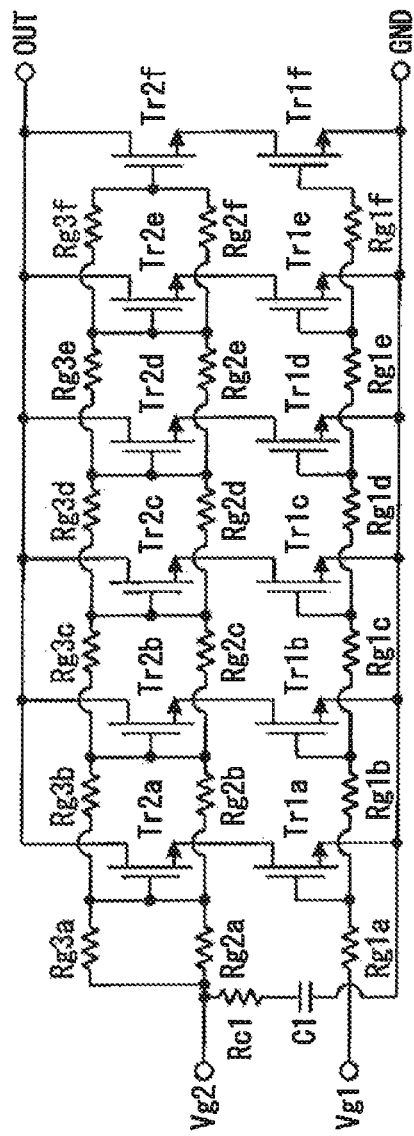
FIG. 2 is a circuit diagram of the cascode amplifier of the first embodiment.

FIG. 1 is a top view of a cascode amplifier in accordance with a first embodiment of the present invention. FIG. 2 is a circuit diagram of the cascode amplifier of the first embodiment. Transistors Tr1a to Tr1f are cascode-connected with transistors Tr2a to Tr2f, respectively. These transistors are n-channel MOS transistors.

A line Wg1 is connected at spaced points along its length to the gates of the transistors Tr1a to Tr1f. A line Wg2 and a line Wg3 are connected at spaced points along their length to the gates of the transistors Tr2a to Tr2f. The lines Wg2 and Wg3 are connected in parallel with each other. One end of a capacitance C1 is connected to one end of the line Wg2 and one end of the line Wg3, and the other end of the capacitance C1 is connected to GND.

The sources of Tr1a to Tr1f are connected through a line Ws to GND. The drains of Tr1a to Tr1f are connected through lines Wsd to the sources of Tr2a to Tr2f, respectively. The drains of Tr2a to Tr2f are connected through a line Wd to an RF output signal terminal OUT.

The line Wg2 is connected to a Vg2 terminal through vias VIA1 and VIA3 and a line Wg4, and the line Wg3 is connected to the Vg2 terminal through vias VIA2 and VIA3 and the line Wg4. It should be noted that the vias VIA1 to VIA3 are used to interconnect upper layer wiring and lower layer wiring in the multilayer wiring process of the LSI process.

In FIG. 2, the symbols Rg1b to Rg1f represent the resistances of the line Wg1 as measured between the gates of neighboring transistors Tr1a and Tr1b, Tr1b and Tr1c, Tr1c and Tr1d, Tr1d and Tr1e, and Tr1e and Tr1f, respectively. The symbols Rg2b to Rg2f represent the resistances of the line Wg2 as measured between the gates of neighboring transistors Tr2a and Tr2b, Tr2b and Tr2c, Tr2c and Tr2d, Tr2d and Tr2e, and Tr2e and Tr2f, respectively. Further, the symbols Rg3b to Rg3f represent the resistances of the line Wg3 as measured between the gates of neighboring transistors Tr2a and Tr2b, Tr2b and Tr2c, Tr2c and Tr2d, Tr2d and Tr2e, and Tr2e and Tr2f, respectively. A resistance Rc1 represents the sum of the wiring resistance between the Vg2 terminal and the capacitance C1 and the parasitic resistance of the capacitance C1. A resistance Rg1a represents the wiring resistance between a Vg1 terminal and the gate of Tr1a. A resistance Rg2a represents the sum of the wiring resistance between the Vg2 terminal and the gate of Tr2a and the contact resistances of the vias VIA1 and VIA3. A resistance Rg3a represents the sum of the wiring resistance between the Vg2 terminal and the gate of Tr2a and the contact resistances of the vias VIA2 and VIA3.

Figure 3:
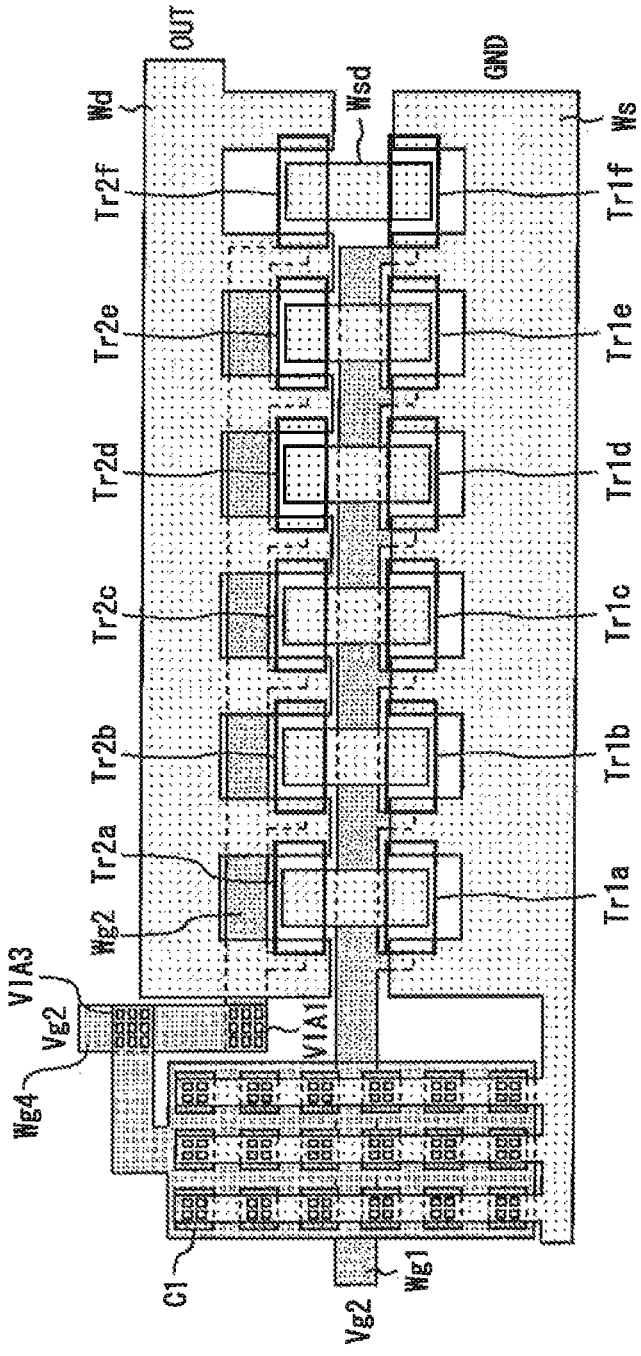
FIG. 3 is a top view of the cascode amplifier of Comparative Example 1.
Figure 4:
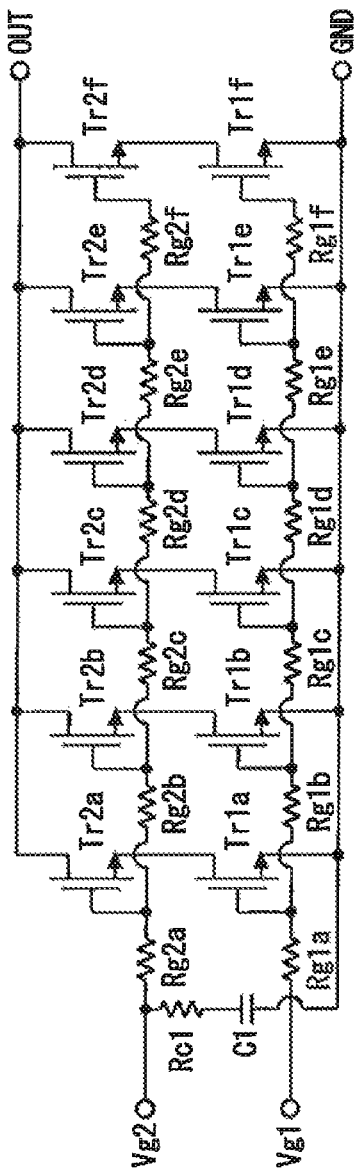
FIG. 4 is a circuit diagram of the cascode amplifier of Comparative Example 1.

Advantages of the present embodiment will now be described in comparison with two conventional cascode amplifiers designated as Comparative Examples 1 and 2, respectively. FIG. 3 is a top view of the cascode amplifier of Comparative Example 1. FIG. 4 is a circuit diagram of the cascode amplifier of Comparative Example 1. The cascode amplifier of Comparative Example 1 does not have the line Wg3 described in connection with the first embodiment; that is, only the line Wg2 is connected at spaced points to the gates of the transistors Tr2a to Tr2f.

Figure 5:
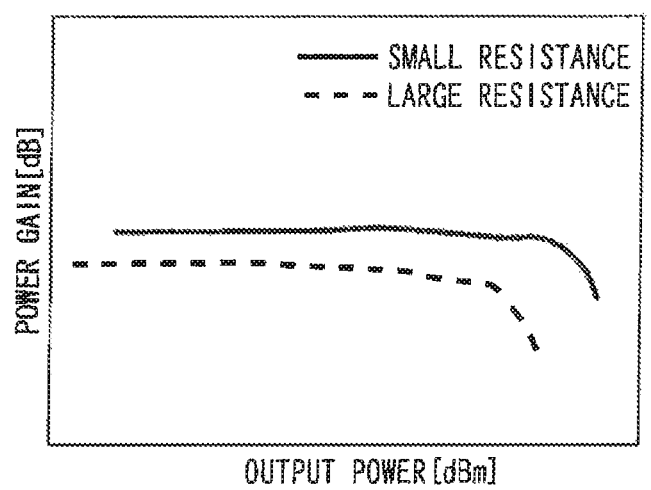
FIG. 5 is a diagram showing the relationship between the resistance of wiring in the cascode amplifier of Comparative Example 1 and the power gain.

FIG. 5 is a diagram showing the relationship between the resistance of wiring in the cascode amplifier of Comparative Example 1 and the power gain. As can be seen from FIG. 5, the power gain and the maximum value of the output power of the cascode amplifier decrease with increasing resistance of the line Wg2.

Figure 6:
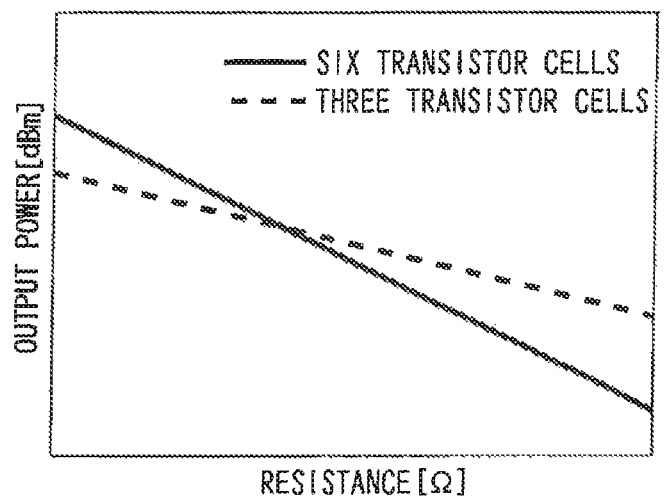
FIG. 6 is a diagram showing the relationship between the resistance of wiring in the cascode amplifier of Comparative Example 1 and the output power when the cascode amplifier is provided with 6 transistor cells and when it is provided with 3 transistor cells.

FIG. 6 is a diagram showing the relationship between the resistance of wiring in the cascode amplifier of Comparative Example 1 and the output power when the cascode amplifier is provided with 6 transistor cells and when it is provided with 3 transistor cells. As can be seen from FIG. 6, the output power of the cascode amplifier is lower when the cascode amplifier has 6 transistor cells than when it has 3 transistor cells. That is, in the case of the cascode amplifier of Comparative Example 1, an increase in the total gate width of the cascode amplifier results in a decrease in the output power, rather than an increase.

Figure 7:
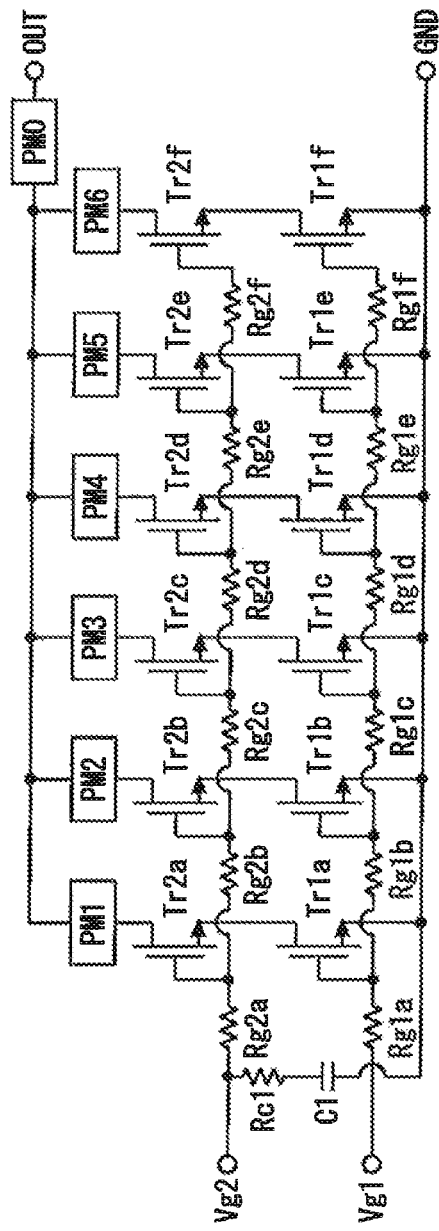
FIG. 7 is a circuit diagram of the cascode amplifier of Comparative Example 2.

FIG. 7 is a circuit diagram of the cascode amplifier of Comparative Example 2. This circuit differs from that of Comparative Example 1 shown in FIG. 4 in that it is provided with a power meter PM0 for monitoring the output power of the entire cascode amplifier and also provided with power meters PM1 to PM6 for monitoring the output power of each cell of the cascode amplifier.

Figure 8:
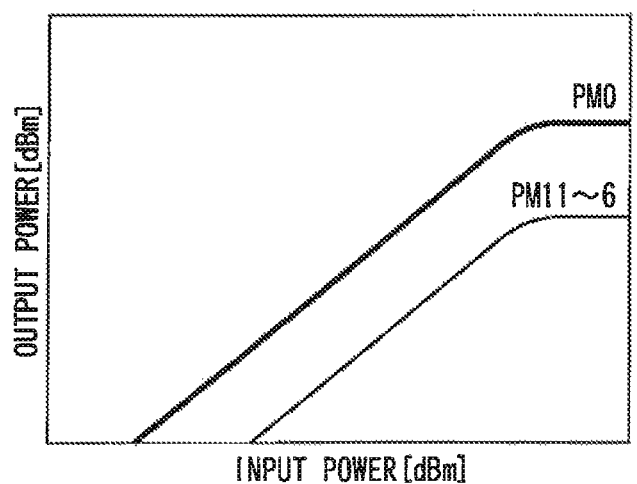
FIG. 8 is a diagram showing the relationship between the input power and the output power of the cascode amplifier of Comparative Example 2 when the resistance of the wiring in the cascode amplifier is assumed to be zero, which is ideal.

FIG. 8 is a diagram showing the relationship between the input power and the output power of the cascode amplifier of Comparative Example 2 when the resistance of the wiring in the cascode amplifier is assumed to be zero, which is ideal. The output power levels of the cells, monitored by the power meters PM1 to PM6, are equal.

Figure 9:
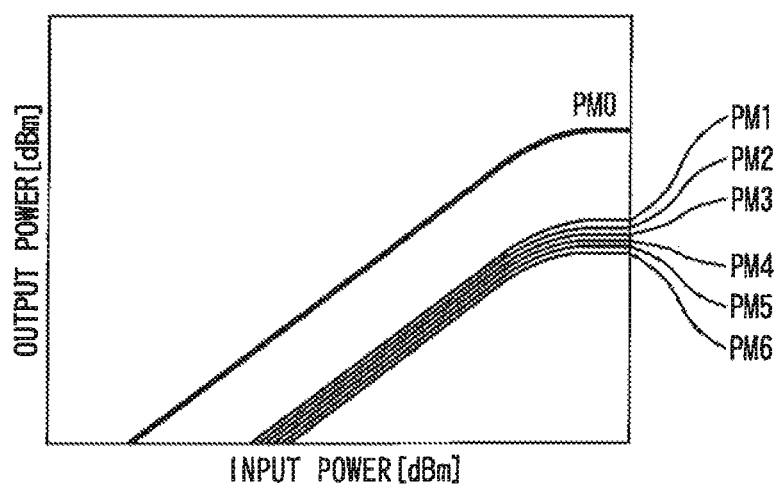
FIG. 9 is a diagram showing the relationship between the input power and the output power of the cascode amplifier of Comparative Example 2 when the wiring in the cascode amplifier has some resistance.

FIG. 9 is a diagram showing the relationship between the input power and the output power of the cascode amplifier of Comparative Example 2 when the wiring in the cascode amplifier has some resistance. The output power levels of the cells of the cascode amplifier, monitored by the power meters PM1 to PM6, are different from one another, indicating that these cells are operating in different conditions.

Thus, the cascode amplifiers of Comparative Examples 1 and 2 are disadvantageous in that an increase in the total gate width results in a decrease in the output power due to the resistance of the line Wg2. (It should be noted that an increase in the total gate width would result in an increase in the output power, not a decrease, if the resistance of the wiring in the cascode amplifiers were zero.) For example, the wiring resistance between the gate of Tr2f and the capacitance C1 is higher than that between the gate of Tr2a and the capacitance C1 by an amount equal to the sum of the resistances Rg2b, Rg2c, Rg2d, Rg2e, and Rg2f. This results in a decrease in the power gain of the cascode amplifier formed by Tr1f and Tr2f and a decrease in the maximum output power that can be drawn from the cascode amplifier.

On the other hand, in the cascode amplifier of the present embodiment, two lines, namely the lines Wg2 and Wg3, are connected in parallel to the gates of Tr2a to Tr2f, making it possible to reduce the wiring resistance between the capacitance C1 and the gates of Tr2a to Tr2f by half, as compared with the cascode amplifiers of Comparative Examples 1 and 2. This configuration may also be applied to a cascode amplifier having a larger gate width so as to minimize reduction of its output power due to wiring resistance. Further, this configuration makes it possible to reduce the differences between the wiring resistances between the gates of the transistors Tr2a to Tr2f and thereby minimize the differences in operating conditions between the cells of the cascode amplifier.

It should be noted that although in the present embodiment two lines, namely the lines Wg2 and Wg3 are connected in parallel to the gates of Tr2a to Tr2f, it is to be understood that three or more lines may be connected in parallel to the gates of Tr2a to Tr2f to provide the same effect.

Further, the resistance of the line Wg1 connected to the gates of Tr1a to Tr1f may also serve to vary the levels of power input to these gates, thereby varying the operating conditions of the cells of the cascode amplifier. Therefore, two or more lines may be connected in parallel to the gates of Tr1a to Tr1f to reduce the differences in input power between these gates and thereby minimize the differences in operating conditions between the cells of the cascode amplifier.

Second Embodiment

Figure 10:
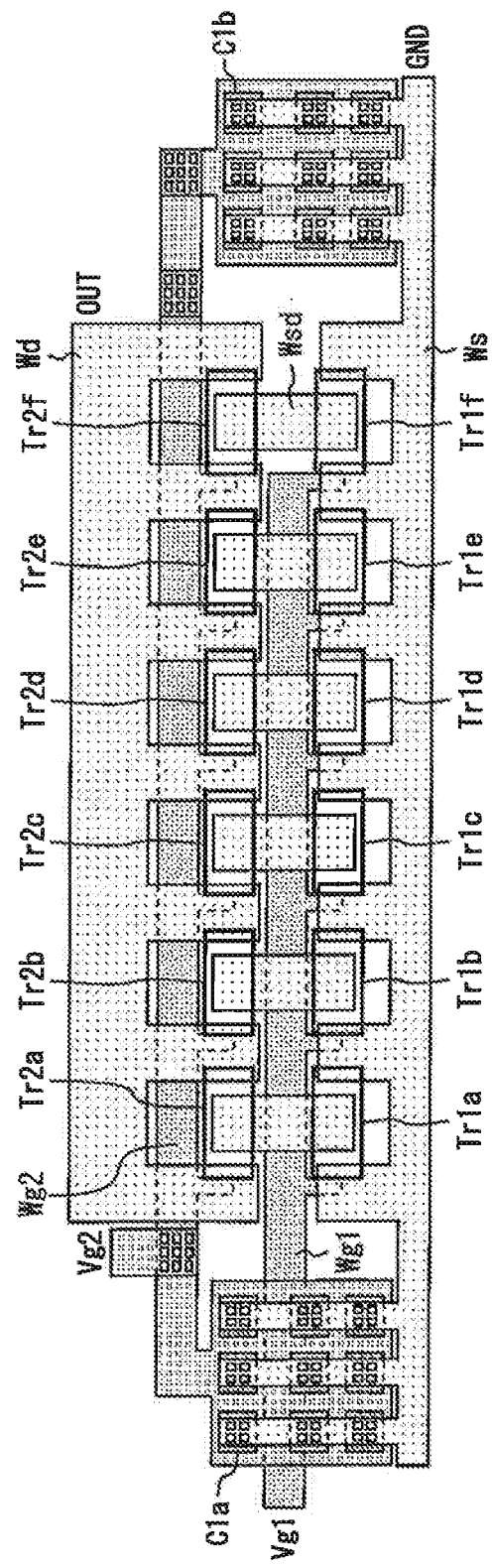
FIG. 10 is a top view of a cascode amplifier in accordance with a second embodiment of the present invention.
Figure 11:
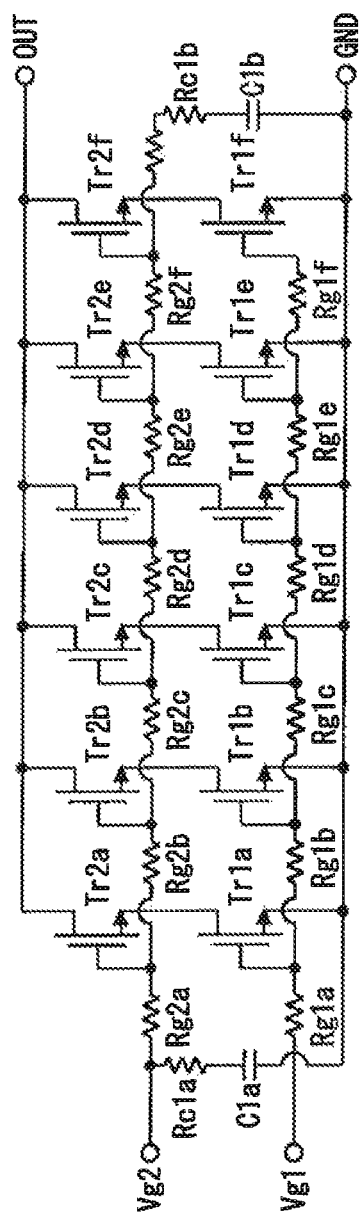
FIG. 11 is a circuit diagram of the cascode amplifier of the second embodiment.

FIG. 10 is a top view of a cascode amplifier in accordance with a second embodiment of the present invention. FIG. 11 is a circuit diagram of the cascode amplifier of the second embodiment. In the cascode amplifier of the second embodiment, unlike that of the first embodiment, a first capacitance C1a is connected between one end of the line Wg2 and ground and a second capacitance C1b is connected between the other end of the line Wg2 and ground. A resistance Rc1a represents the sum of the parasitic resistances of the line and vias connected in series between the Vg2 terminal and the first capacitance C1a. A resistance Rc1b represents the sum of the parasitic resistances of the line and vias connected in series between the gate of Tr2f and the second capacitance C1b.

The cascode amplifier of the present embodiment is provided with two RF grounding capacitances, namely the first capacitance C1a and the second capacitance C1b, instead of only one RF grounding capacitance (as in the first embodiment). This configuration allows the parasitic resistance of each capacitance to be lower than the parasitic resistance of the grounding capacitance C1 of the cascode amplifier of the first embodiment. Further, since the capacitances C1a and C1b are connected to the opposite ends of the line Wg2, the wiring resistance between, e.g., the transistor Tr2c (which is located near the center of the length of the cascode amplifier) and the capacitance C1a or C1b is substantially half the wiring resistance between the transistor Tr2f and the capacitance C1 of the cascode amplifier of Comparative Example 1, making it possible to minimize reduction of the output power due to wiring resistance. Further, this configuration makes it possible to reduce the differences between the wiring resistances between the gates of the transistors Tr2a to Tr2f and thereby minimize the differences in operating conditions between the cells of the cascode amplifier.

Third Embodiment

Figure 12:
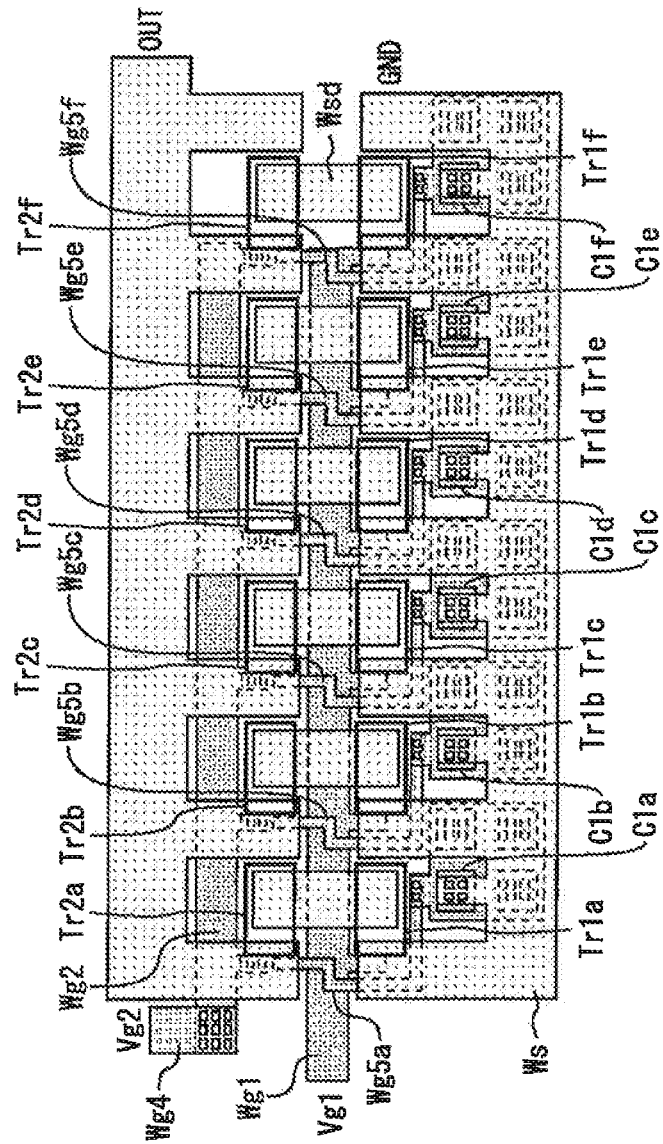
FIG. 12 is a top view of a cascode amplifier in accordance with a third embodiment of the present invention.
Figure 13:
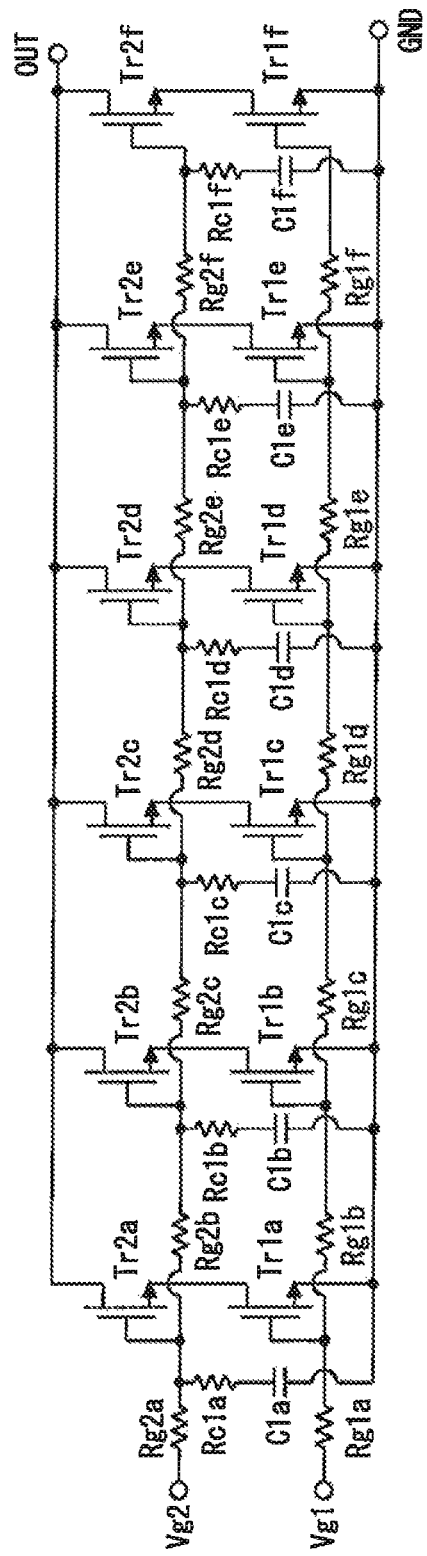
FIG. 13 is a circuit diagram of the cascode amplifier of the third embodiment.

FIG. 12 is a top view of a cascode amplifier in accordance with a third embodiment of the present invention. FIG. 13 is a circuit diagram of the cascode amplifier of the third embodiment. In the cascode amplifier of the third embodiment, unlike that of the first embodiment, capacitances C1a to C1f are connected at one end to the gates of the transistors Tr2a to Tr2f by lines Wg5a to Wg5f, respectively, and connected at the other end to GND. Resistances Rc1a to Rc1f (see FIG. 13) represent the sum of the parasitic resistances of the line and vias connected in series between the capacitances C1a to C1f and the gates of the transistors Tr2a to Tr2f, respectively; specifically, the resistance Rc1a represents the sum of the parasitic resistances of the line Wg5a and vias by which the capacitance C1a is connected to the gate of the transistor Tr2a, the resistance Rc1b represents the parasitic resistances of the line Wg5b and vias by which the capacitance C1b is connected to the gate of the transistor Tr2b, and so on.

Thus, in the cascode amplifier of the present embodiment, each of the six cells has a grounding capacitance connected thereto. This means that these grounding capacitances can be smaller in area than the grounding capacitance C1 of the first embodiment, making it possible to reduce wiring resistance. Further, whereas in the cascode amplifier of the first embodiment the gates of the transistors Tr2a to Tr2f are connected to the grounding capacitance C1 through a single common line, in the cascode amplifier of the present embodiment the gates of Tr2 to Tr2f are connected to the capacitances C1a to C1f through different lines. This configuration allows the wiring resistance between the gates of the transistors Tr2 to Tr2f and the capacitances C1a to C1f, respectively, to be lower than the wiring resistance between the gates of the transistors Tr2 to Tr2f and the capacitance C1 in the cascode amplifier of the first embodiment, making it possible to minimize reduction of the output power due to wiring resistance. Further, since each of the cells of the cascode amplifier of the present embodiment has a grounding capacitance connected thereto, the resistances Rg2b to Rg2f of the line Wg2 as measured between the gates of neighboring transistors Tr2a and Tr2b, Tr2b and Tr2c, Tr2c and Tr2d, Tr2d and Tr2e, and Tr2e and Tr2f, respectively, can be ignored, making it possible to minimize the differences in operating conditions between the cells of the cascode amplifier.

Fourth Embodiment

Figure 14:
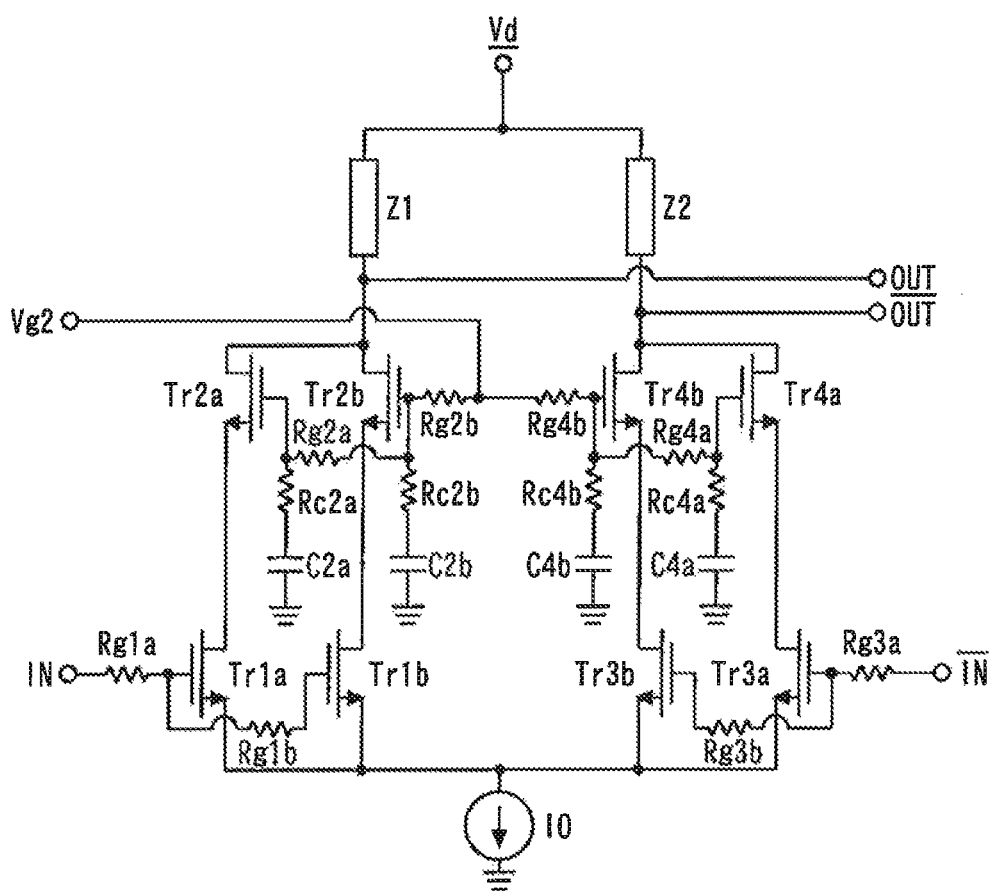
FIG. 14 is a circuit diagram of a cascode amplifier in accordance with a fourth embodiment of the present invention.

FIG. 14 is a circuit diagram of a cascode amplifier in accordance with a fourth embodiment of the present invention. This cascode amplifier is a differential amplifier. In this cascode amplifier, a cascode amplifier made up of transistors Tr1a, Tr1b, Tr2a, and Tr2b and a cascode amplifier made up of transistors Tr3a, Tr3b, Tr4a, and Tr4b form a differential pair. Capacitances C2a, C2b, C4a, and C4b are connected at one end to the gates of Tr2a, Tr2b, Tr4a, and Tr4b, respectively, and at the other end to GND.

Figure 15:
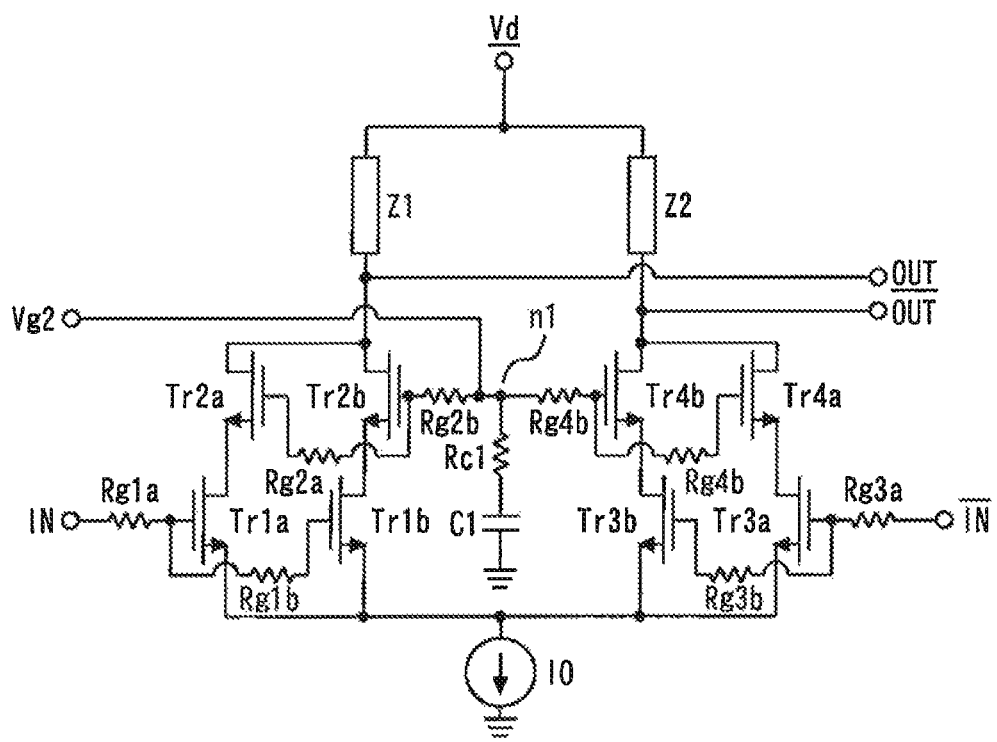
FIG. 15 is a circuit diagram of the cascode amplifier of Comparative Example 3.
Figure 16:
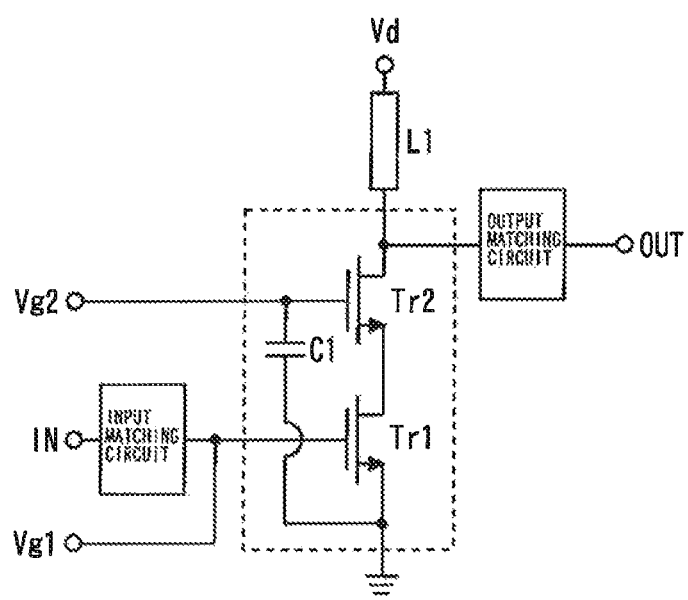
FIG. 16 is a circuit diagram showing the basic configuration of a cascode amplifier.

Advantages of the present embodiment will now be described in comparison with a conventional cascode amplifier designated as Comparative Example 3. FIG. 15 is a circuit diagram of the cascode amplifier of Comparative Example 3. In the cascode amplifier of Comparative Example 3, one grounding capacitance, namely capacitance C1, is connected at one end to the junction n1 between the gates of Tr2a, Tr2b, Tr4a, and Tr4b, and at the other end to ground. This configuration, however, is disadvantageous in that in order to virtual grounding in the cascode amplifier, it is necessary to increase the grounding capacitance if the total gate width of the cascode amplifier is increased, since an increase in the total gate width results in increased impact of the wiring resistances Rc1, Rg2a, Rg2b, Rg4a, and Rg4b shown in FIG. 15.

In the cascode amplifier of the present embodiment, on the other hand, each of the four cells has a grounding capacitance connected thereto. This means that these grounding capacitances can be smaller in area than the grounding capacitance C1 of the cascode amplifier of Comparative Example 3, making it possible to reduce wiring resistance. Further, whereas in the cascode amplifier of Comparative Example 3 the gates of the transistors Tr2a, Tr2b, Tr4a, and Tr4b are connected to the grounding capacitance C1 through a single common line, in the cascode amplifier of the present embodiment the gates of Tr2a, Tr2b, Tr4a, and Tr4b are connected to the grounding capacitances C2a, C2b, C4a, and C4b through different lines. This configuration allows the wiring resistance between the gates of Tr2a, Tr2b, Tr4a, and Tr4b and the grounding capacitances C2a, C2b, C4a, and C4b, respectively, to be lower than the wiring resistance between the gates of the transistors Tr2a, Tr2b, Tr4a, and Tr4b and the grounding capacitance C1 in the cascode amplifier of Comparative Example 3, making it possible to achieve virtual grounding at the junction n1 between the gates of Tr2a, Tr2b, Tr4a, and Tr4b in the differential amplifier (or cascode amplifier of the present embodiment) while minimizing the values of the grounding capacitances C2a, C2b, C4a, and C4b.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-247144, filed on Nov. 9, 2012, including specification, claims, drawings, and summary, on which the Convention priority of the present application is based, is incorporated herein by reference in its entirety.

What is claimed is:

1. A cascode amplifier comprising:
   a plurality of first transistors;

a plurality of second transistors cascode-connected with the plurality of first transistors, respectively;

a first line, having a length and connected, at spaced points along its length, to control terminals of the plurality of first transistors;

a second line having a length and connected, at spaced points along its length, to control terminals of the plurality of second transistors; and a capacitance connected between an end of the second line and ground, wherein the second line includes at least two lines connected in parallel with each other.

2. The cascode amplifier according to claim 1, wherein the first line includes at least two lines connected in parallel with each other.

3. The cascode amplifier according to claim 1, wherein the plurality of first transistors and the plurality of second transistors are n-channel MOS transistors.

4. A cascode amplifier comprising:

a plurality of first transistors;

a plurality of second transistors cascode-connected with the plurality of first transistors, respectively;

a first line having a length and connected, at spaced points along its length, to control terminals of the plurality of first transistors;

a second line having a length and connected, at spaced points along its length, to control terminals of the plurality of second transistors;

a first capacitance connected between a first end of the second line and ground; and a second capacitance connected between a second end of the second line and ground.

5. The cascode amplifier according to claim 4, wherein the plurality of first transistors and the plurality of second transistors are n-channel MOS transistors.

6. A cascode amplifier comprising:

a plurality of first transistors;

a plurality of second transistors cascode-connected with the plurality of first transistors, respectively;

a first line having a length and connected, at spaced points along its length, to control terminals of the plurality of first transistors;

a second line having a length and connected, at spaced points along its length, to control terminals of the plurality of second transistors; and a plurality of capacitances connected at a first end to the control terminals of the plurality of second transistors and connected at a second end to ground.

7. The cascode amplifier according to claim 6, wherein the cascode amplifier is a differential amplifier.

8. The cascode amplifier according to claim 6, wherein the plurality of first transistors and the plurality of second transistors are n-channel MOS transistors.

* * * * *